United States Patent
Guan et al.

(10) Patent No.: US 12,088,268 B2
(45) Date of Patent: Sep. 10, 2024

(54) VARIABLE-GAIN AMPLIFIER AND PHASED ARRAY SYSTEM

(71) Applicant: HUAWEI TECHNOLOGIES CO.,LTD., Guangdong (CN)

(72) Inventors: Yunchao Guan, Shenzhen (CN); Lei Lu, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 538 days.

(21) Appl. No.: 17/362,885

(22) Filed: Jun. 29, 2021

(65) Prior Publication Data

US 2021/0328565 A1     Oct. 21, 2021

Related U.S. Application Data

(63) Continuation of application No. PCT/CN2018/125850, filed on Dec. 29, 2018.

(51) Int. Cl.
*H03F 3/217*     (2006.01)
*H03F 3/193*     (2006.01)
(Continued)

(52) U.S. Cl.
CPC ........... *H03G 3/3036* (2013.01); *H03F 3/193* (2013.01); *H03F 2200/451* (2013.01);
(Continued)

(58) Field of Classification Search
CPC ........... H03G 3/3036; H03G 2201/103; H03G 2201/307; H03G 1/0023; H03G 1/0029;
(Continued)

(56) References Cited

U.S. PATENT DOCUMENTS

2004/0207471 A1    10/2004   Raja et al.
2006/0164164 A1     7/2006   Rogers et al.
(Continued)

FOREIGN PATENT DOCUMENTS

CN     101043203 A     9/2007
CN     103051291 A     4/2013
(Continued)

OTHER PUBLICATIONS

Byeon Chul Woo et al: Low gain imbalance low noise amplifier phase shifter in 65nm CMOS for 60GHz phased array receiver Proceedings of the 4 7th European Microwave Conference, Oct. 10, 2017 (Oct. 10, 2017), XP033284595 Total:4Pages.
(Continued)

*Primary Examiner* — Andrea Lindgren Baltzell
*Assistant Examiner* — Khiem D Nguyen
(74) *Attorney, Agent, or Firm* — Gregg Jansen

(57) ABSTRACT

A variable-gain amplifier and a phased array system are provided. A variable-gain amplifier includes a cascode circuit comprising a first amplification transistor and a second amplification transistor array that are cascaded, the second amplification transistor array comprising a plurality of second amplification transistors connected in parallel and configured to output an adjustable current to an output matching network, the first amplification transistor is a common-source transistor, the plurality of second amplification transistors are common-gate transistors, or the cascode circuit is a common-emitter common-base circuit, the first amplification transistor is a common-emitter amplification circuit, and the second amplification transistor array is a common-base amplification circuit. The variable-gain amplifier further including a variable capacitor circuit coupled to the second amplification transistor array and coupled to the output matching network at first nodes.

19 Claims, 14 Drawing Sheets

(51) Int. Cl.
  *H03G 3/30*   (2006.01)
  *H04B 1/04*   (2006.01)
  *H04B 1/16*   (2006.01)
  *H04B 1/40*   (2015.01)

(52) U.S. Cl.
  CPC .  *H03G 2201/103* (2013.01); *H03G 2201/307* (2013.01); *H04B 1/04* (2013.01); *H04B 1/16* (2013.01); *H04B 1/40* (2013.01)

(58) Field of Classification Search
  CPC ........ H03G 1/0088; H03G 5/28; H03F 3/193; H03F 2200/451; H03F 2203/7236; H03F 1/565; H03F 3/45188; H03F 2200/111; H03F 2203/45481; H03F 3/72; H03F 3/68; H04B 1/04; H04B 1/16; H04B 1/40
  USPC ....................................................... 330/278
  See application file for complete search history.

(56) References Cited

U.S. PATENT DOCUMENTS

| | | |
|---|---|---|
| 2007/0080750 A1 | 4/2007 | Liebenrood |
| 2008/0031382 A1 | 2/2008 | Aoki |
| 2008/0032661 A1 | 2/2008 | Ojo et al. |
| 2010/0328542 A1* | 12/2010 | Kammula ........... H03F 3/45179 330/253 |
| 2012/0032743 A1 | 2/2012 | Hsieh et al. |
| 2013/0120190 A1* | 5/2013 | McCune, Jr. ........ H03B 5/1852 342/368 |

FOREIGN PATENT DOCUMENTS

| | | |
|---|---|---|
| CN | 104521138 A | 4/2015 |
| CN | 110557100 A | 12/2019 |
| EP | 2182631 A2 | 5/2010 |
| JP | 2008227667 A | 9/2008 |
| TW | I644512 B | 12/2018 |
| WO | 2016131027 A1 | 8/2016 |

OTHER PUBLICATIONS

Liu Shengfu et al, A Gain-Controlled Driver Amplifier for UHF RFID Reader, 2011, 4 pages.

* cited by examiner

VARIABLE-GAIN AMPLIFIER AND PHASED ARRAY SYSTEM

CROSS-REFERENCE TO RELATED APPLICATIONS

This application is a continuation of International Application No. PCT/CN2018/125850, filed on Dec. 29, 2018, the disclosure of which is hereby incorporated by reference in its entirety.

TECHNICAL FIELD

This application relates to the field of communications technologies, and in particular, to a variable-gain amplifier and a phased array system that have a constant phase and a constant step gain.

BACKGROUND

Fifth-generation (5G) mobile communications is a new generation wireless system and network architecture that provides higher data rates, lower-latency connections, and higher bandwidth in millimeter wave (mm wave) bands (such as 28 GHz, 39 GHz, 60 GHz, and 86 GHz) to support many high data rate applications, such as communications of a 5G mobile phone, a wireless infrastructure, wireless gigabit alliance (WiGig), an advanced driver assistance system (ADAS), a small cell, and a broadband satellite.

With the advent of the 5G era, applications of a phased array technology supporting multiple-input multiple-output (MIMO) in a 5G system are unprecedentedly developed, and a multi-channel transceiver with a beamforming function is widely studied and applied.

The phased array system needs to use a variable-gain amplifier (VGA) or attenuator in each transmit/receive channel to compensate for gain variations between array elements. FIG. 1 shows a typical phased array transmitter. Signals of each channel transmitted by the transmitter with a specific phase are spatially superimposed to form a signal beam with enhanced signal power and directivity. As shown in FIG. 1, in any transmit channel, in addition to phase control by using a phase shifter, a VGA needs to be further used to provide a specific dynamic gain, and the VGA needs to maintain a relatively constant phase during gain switching.

FIG. 2 shows a VGA implementation solution in the conventional technology. The VGA uses a cascode structure, a common-gate transistor is split into a plurality of transistors (transistors M3 to M8 in the figure), and gain switching is implemented by controlling to turn on the common-gate transistor. For example, M3 and M4 always remain turned-on during normal operation. In a high gain mode, M5 and M6 remain turned-on, and M7 and M8 are off. In this case, all signal currents flow to an output matching network through first nodes (ports C and D) in the figure. In a low gain mode, the transistors M5 and M6 are off, and the transistors M7 and M8 remain turned-on at the same time. Because only some currents flow to the output matching network, a gain decrease is caused, thereby implementing gain switching.

However, in the foregoing solution, when the gain changes, the phase cannot be kept constant. In addition, a gain step is inconsistent at different frequencies. Therefore, performance of a phased array receiver deteriorates.

Particularly, for 5G, because bandwidth of a 5G signal is relatively high, how to maintain consistency of a VGA gain step in a wide frequency band is also one of difficulties in a radio frequency front-end design.

SUMMARY

Embodiments of this application disclose a variable-gain amplifier and a phased array system that have consistency of a phase and a step gain during gain switching, to overcome a problem that performance of an existing VGA deteriorates during gain switching.

According to a first aspect, an embodiment of this application provides a variable-gain amplifier, including: a cascode circuit including a first amplification transistor and a second amplification transistor array, the second amplification transistor array including a plurality of second amplification transistors connected in parallel, and is configured to output an adjustable current to an output matching network, and the cascode circuit is a cascode circuit, the first amplification transistor is a common-source transistor, and the second amplification transistor is a common-gate transistor, or the cascode circuit is a common-emitter common-base circuit, the first amplification transistor is a common-emitter amplifier, and the second amplification transistor is a common-base amplifier; and a variable capacitor circuit, separately coupled to the second amplification transistor array and the output matching network at first nodes, and configured to adjust a parasitic capacitance of the second amplification transistor array relative to the output matching network. When the VGA performs gain switching, a turn-on status of the second amplification transistor in the second amplification transistor array changes. Correspondingly, a parasitic capacitance of the cascode circuit relative to the first node changes accordingly when viewed from the first node. However, a change in the parasitic capacitance causes a change in output matching of the VGA during gain switching. As a result, a constant phase and consistency of gain steps at different frequencies cannot be ensured. In this embodiment, the variable capacitor circuit is introduced. When the VGA performs gain switching, a capacitance value of the variable capacitor circuit is adjusted to compensate for a change of the parasitic capacitance caused by the second amplification transistor array relative to the first node during gain switching. Therefore, before and after gain switching, the parasitic capacitance viewed from the first node remains approximately constant, and correspondingly, the matching of the final output of the VGA remains consistent. In this manner, the consistency of the gain step and phase can be maintained in a wide frequency band when the VGA performs gain switching.

With reference to the first aspect, in a possible implementation, the variable capacitor circuit is specifically configured to: when the variable-gain amplifier performs gain switching, compensate for the parasitic capacitance change of the second amplification transistor array relative to the output matching network.

With reference to any one of the first aspect or the possible implementation of the first aspect, in a possible implementation, the variable capacitor circuit includes a varactor transistor, where one end of the varactor transistor is coupled to the first node, and the other end of the varactor transistor is connected to a control voltage used to adjust a capacitance value of the varactor transistor.

With reference to any one of the first aspect or the possible implementations of the first aspect, in a possible implementation, the variable capacitor circuit includes a metal oxide semiconductor (MOS) transistor, a gate of the MOS transistor is coupled to the first node, and a source and a drain of the MOS transistor are short-circuited and then connected to a control voltage used to adjust a gate capacitance of the MOS transistor.

With reference to any one of the first aspect or the possible implementations of the first aspect, in a possible implementation, the variable capacitor circuit includes a switch and a capacitor. One end of the switch is coupled to one end of the capacitor, the other end of the capacitor is coupled to the first node, and the other end of the switch is connected to a control voltage. The capacitance value of the variable capacitor circuit is changed by controlling the switch to be turned on or off.

With reference to the first aspect, in another possible implementation, the second amplification transistor array is configured to output an adjustable current by changing a quantity of second amplification transistors to be turned on between the second amplification transistor array and the output matching network.

With reference to the foregoing possible implementation of the first aspect, in a possible implementation, the first amplification transistor is a transistor M1. The second amplification transistor array includes a transistor M3 and at least one group of transistor branches, and the transistor branches include a transistor M5 and a transistor M7, where sources of the transistor M3, the transistor M5, and the transistor M7 are coupled to a drain of the transistor M1/emitters of the transistor M3, the transistor M5, and the transistor M7 are coupled to a collector of the transistor M1, a drain/collector of the transistor M7 is connected to a power supply voltage, and drains/collectors of the transistor M3 and the transistor M5 are coupled to the first node.

In a possible implementation, the cascode circuit further includes an inductor. One end of the inductor is coupled to a drain/collector of the transistor M1, and the other end of the inductor is separately coupled to sources/emitters of the transistor M3, the transistor M5, and the transistor M7.

With reference to any one of the first aspect or the possible implementations of the first aspect, in a possible implementation, the cascode circuit is a differential circuit or a single-ended circuit.

With reference to any one of the first aspect or the possible implementations of the first aspect, in a possible implementation, the variable capacitor circuit is a differential circuit or a single-ended circuit.

According to a second aspect, an embodiment of this application provides a phased array system, including a plurality of channels, where any channel includes a variable-gain amplifier provided in any one of the first aspect or the possible implementations of the first aspect.

In this embodiment, the variable-gain amplifier provided in the first aspect may keep a constant phase and a constant gain step during gain switching. Therefore, when the variable-gain amplifier is applied to the phased array system, the phased array system may have good phase consistency and gain performance when working in a millimeter wave band.

With reference to the second aspect, in a possible implementation, the phased array system may be a phased array receiver, a phased array transmitter, or a phased array transceiver.

With reference to the second aspect, in a possible implementation, the phased array system works on a 5G NR frequency band.

With reference to any one of the second aspect or the possible implementations of the second aspect, in a possible implementation, the 5G NR frequency band includes an n257 frequency band, an n258 frequency band, an n260 frequency band, or an n261 frequency band.

BRIEF DESCRIPTION OF DRAWINGS

FIG. 4b is a schematic diagram of a step gain curve of a VGA shown in FIG. 3a;

FIG. 5b is a schematic diagram of a phase curve of a VGA shown in FIG. 3a;

DESCRIPTION OF EMBODIMENTS

The following describes the embodiments of this application in detail with reference to the accompanying drawings in the embodiments of this application.

In the specification, claims, and accompanying drawings of this application, the terms "first", "second", and the like are intended to distinguish between different objects but do not indicate a particular order. In addition, the terms "including", "having", or any other variant thereof, are intended to cover a non-exclusive inclusion. For example, a process, a method, a system, a product, or a device that includes a series of steps or units is not limited to the listed steps or units, but optionally further includes an unlisted step or unit, or optionally further includes another inherent step or unit of the process, the method, the product, or the device.

It should be understood that in this application, "at least one (item)" means one or more, "plurality" means two or more, "at least two (item)" means two or more, "and/or" is used to describe an association relationship of an associated object, indicating that there may be three relationships, for example, "A and/or B" may indicate: only A exists, only B exists, and both A and B exist, where A and B may be singular or plural. The character "/" generally indicates an "or" relationship between the associated objects. "At least one item (piece) of the following", or a similar expression thereof refers to any combination of these items, including any combination of a single item (piece) or a plurality of items (pieces). For example, at least one item (piece) of a, b, or c may represent a, b, c, "a and b", "a and c", "b and c", or "a and b and c", where, a, b, c may be singular and plural.

Figure 3A:
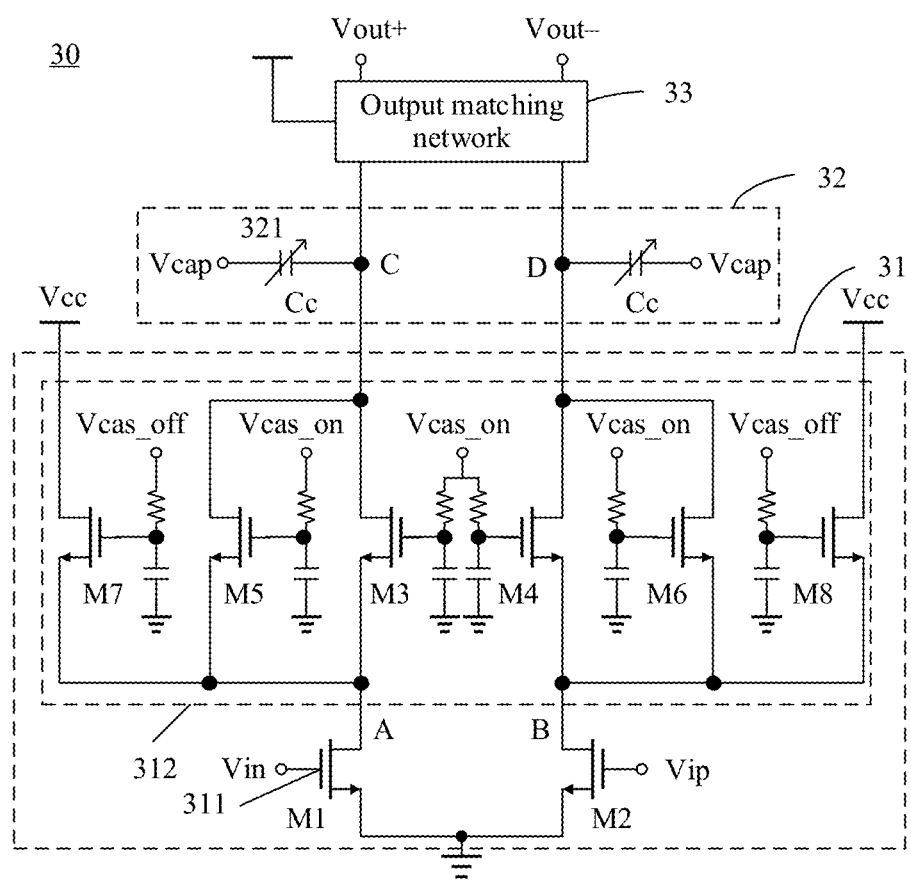
FIG. 3a to FIG. 3e are schematic structural diagrams of a VGA according to an embodiment of this application.

As shown in FIG. 3a, an embodiment of this application provides a variable-gain amplifier (VGA) 30 with a constant phase and a constant step gain.

The VGA 30 in an embodiment includes a cascode circuit 31. The cascode circuit 31 includes a common-source transistor 311 (M1 and M2) and a common-gate transistor array 312 including a plurality of common-gate transistors (M3, M4, M5, M6, M7, and M8) connected in parallel. The common-source transistor 311 is configured to convert an input voltage Vin into a current. The common-gate transistor array 312 is configured to adjust a current output by the common-source transistor 311 to output an adjustable current to first nodes (C and D), with current being outputted for an output matching network 33. The VGA 30 in this embodiment also includes a variable capacitor circuit 32 coupled to the first nodes (C and D) and therefore coupled to the common-gate transistor array 312 and to the output matching network 33. The variable capacitor circuit 32 is configured to adjust a parasitic capacitance of the common-gate transistor array 312 relative to the output matching network 33. The VGA 30 in this embodiment also includes the output matching network 33. The output matching network 33 is configured to convert the current output by the common-gate transistor array 312 into a voltage, output the voltage externally, and adjust impedance matching during the output.

Figure 3B:
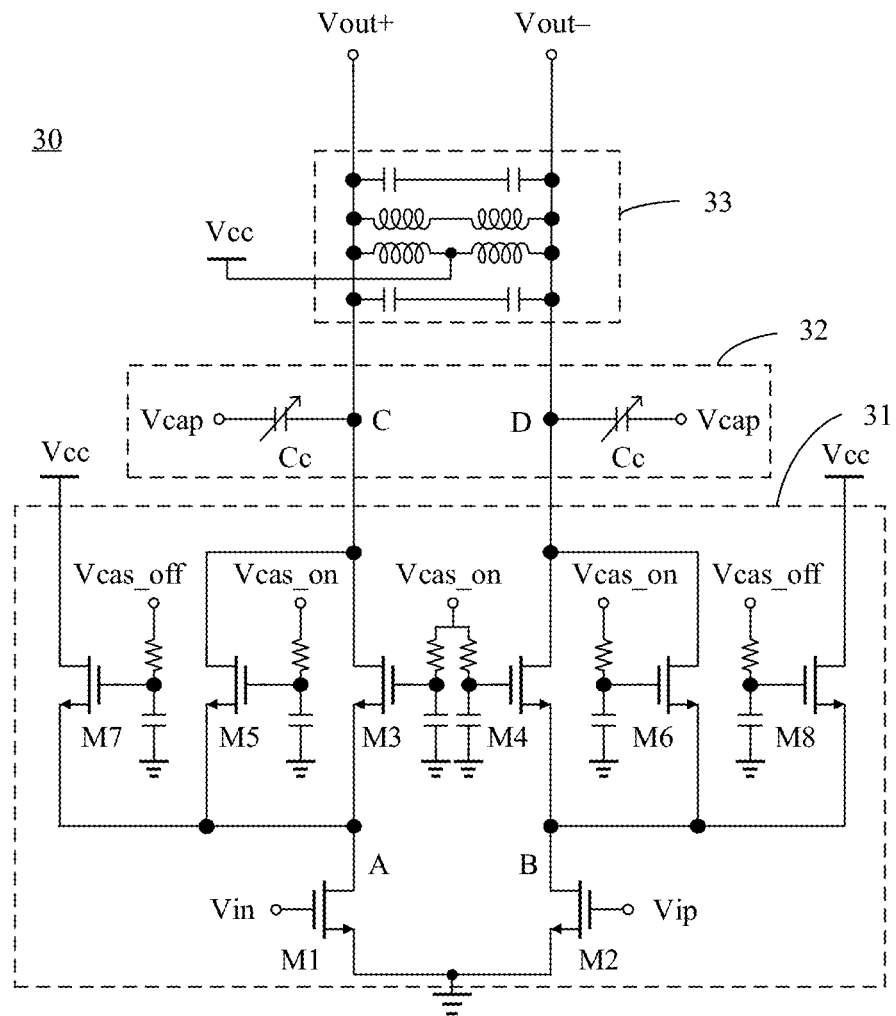

In this embodiment, the output matching network 33 in the VGA 30 needs to have both a load matching function and an impedance matching function. Therefore, the output matching network 33 may also be referred to as a load and matching network, a matching load, or the like. For example, as shown in FIG. 3b, the output matching network 33 may be a balun with a tuning capacitor. A person skilled in the art should know that another similar structure may be used to implement an impedance matching function, for example, a transformer or an inductor. Therefore, the output matching network 33 in this application is not limited to the specific example provided in FIG. 3b.

It should be noted that a person skilled in the art should know that the cascode circuit is also referred to as a cascade amplifier, and may be implemented based on a metal oxide semiconductor (MOS) transistor, or may be implemented based on a triode. When implemented by using a MOS transistor, the circuit may be referred to as a cascode circuit. When implemented using a triode, the cascode circuit may also be referred to as a common-emitter common-base circuit, and a working principle is similar to that of the cascode circuit. To be specific, in this embodiment, the cascode circuit 31 may be considered to include a first amplification transistor and a second amplification transistor array that are cascaded. The second amplification transistor array includes a plurality of second amplification transistors connected in parallel. If the cascode circuit is a common-source and common-gate circuit, the first amplification transistor is a common-source transistor, and the second amplification transistor is a common-gate transistor. If the cascode circuit is a common-emitter common-base circuit, the first amplification transistor is a common-emitter amplification circuit, and the second amplification transistor is a common-base amplification circuit. The MOS transistor and the triode may be collectively referred to as a transistor. For simplicity, a working principle of the VGA 30 is further described below using a cascode circuit implemented based on a MOS transistor as an example.

As shown in FIG. 3a, a common-source transistor M1 and common-gate transistors M3, M5, and M7 connected in parallel in a common-gate transistor array 312 form a first group of cascode circuits, where sources of M3, M5 and M7 are separately coupled to a drain of the common-source transistor M1 at a second node (A), a drain of the common-source transistor M7 is coupled to a power supply voltage Vcc, and drains of the common-gate transistors M3 and M5 are separately coupled to the output matching network 33 through a first node (C). A common-source transistor M2 and common-gate transistors M4, M6, and M8 form a second group of cascode circuits. The first group of cascode circuits and the second group of cascode circuits are differential circuits. Similarly, sources of the common-gate transistors M4, M6, and M8 are separately coupled to a drain of the common-source M2 at a second node (B), a drain of the common-gate transistor M8 is coupled to a power supply voltage Vcc, and drains of the common-gate transistors M4 and M6 are coupled to the output matching network 33.

It should be noted that a circuit of a differential structure is generally designed symmetrically. For example, the common-source transistor M1 and the common-source transistor M2 are symmetrical, the common-gate transistors M3 and M4 are symmetrical, M5 and M6 are symmetrical, and M7 and M8 are also symmetrical. Correspondingly, the variable capacitor circuit 32 further includes a differential variable capacitor. Therefore, for the differential structure, for ease of description, only one path in the differential structure is marked and described in detail in the following embodiments and the accompanying drawings. It should be understood that the one path and the other path not marked in the differential structure may be mutually referenced, and the details are not described again.

In this embodiment, when the VGA 30 works normally, a turn-on control signal Vcas_on is applied to gates of M3 and M4, so that M3 and M4 remain turned-on. Therefore, a part of currents input from the drains of the common-source transistors M1 and M2 are output to the output matching network 33 through M3 and M4. When the VGA 30 switches to a high gain mode, a turn-on control signal Vcas_on is applied to gates of the common-gate transistors M3, M4, M5, and M6 separately, to control the common-gate transistors M3, M4, M5, and M6 to be turned on. Meanwhile, a turn-off control signal Vcas_off is applied to gates of the common-gate transistors M7 and M8 separately, to control the common-gate transistors M7 and M8 to be turned off. In this case, all currents input to the common-gate transistor array 312 from the cascode transistors M1 and M2 flow to the output matching network 33. When the VGA 30 switches to a low gain mode, a turn-on control signal Vcas_on is applied to the gates of the common-gate transistors M3, M4, M7, and M8, to control the common-gate transistors M3, M4, M7, and M8 to be turned on. Meanwhile, a turn-off control signal Vcas_off is applied to the gates of the common-gate transistors M5 and M6, to control the common-gate transistors M5 and M6 to be turned off. In this case, only a part of the currents input to the common-gate transistor array 312 from the cascode transistors M1 and M2 flow to the output matching network 33, and the other part of the currents output by the cascode transistors M1 and M2 are shunted by M7 and M8. Therefore, the gain is reduced.

It should be learned that, when the cascode circuit is implemented based on a triode, for a structure of the common-emitter common-base circuit, reference may be made to a structure shown in FIG. 3a. Similarly, the common-emitter amplification circuit M1 and the common-base amplification circuits M3, M5, and M7 form a first group of cascode circuits, where emitters of the common-base amplification circuits M3, M5 and M7 are separately coupled to a collector of a common-emitter amplification circuit M1 at a second node (A), and a collector of a common-base amplification circuit M7 is coupled to a power supply voltage Vcc, collectors of the common-base amplification circuits M3 and M5 are separately coupled to the output matching network 33 through a first node (C). For details of driving principles of the cascode circuit and the common-emitter common-base circuit, refer to the conventional technology. Details are not described herein.

When the VGA 30 performs gain switching, a turn-on status of the common-gate transistor in the common-gate transistor array 312 changes. Correspondingly, when viewed from the first nodes (C and D), a parasitic capacitance of the cascode circuit 31 relative to the first nodes (C and D) also changes accordingly. Specifically, the high gain mode and the low gain mode are used as examples. In the two gain modes, parasitic capacitances contributed by the common-gate transistors M5 and M6 to one end of the output matching network 33 change. When the VGA 30 switches from a high gain to a low gain, a parasitic capacitance of the cascode circuit 31 viewed from the first nodes (C and D) decreases. A change in the parasitic capacitance causes a change in the output matching of the VGA 30 during gain switching. As a result, the constant phase and the consistency of the gain step at different frequencies cannot be ensured.

Based on this, the variable capacitor circuit 32 is introduced in this embodiment. When the VGA 30 performs gain switching by adjusting a capacitance value of the variable capacitor circuit 32, during gain switching the common-gate transistor array 312 compensates for a parasitic capacitance change caused by the first nodes (C and D), so that the parasitic capacitance viewed from the first nodes (C and D) remains approximately constant before and after the gain switching, and correspondingly, the matching of the final output of the VGA 30 remains consistent. In this manner, when the VGA 30 performs gain switching, the gain step and the phase of the VGA 30 can be kept substantially constant in a wide frequency band.

In this application, as shown in FIG. 3a, the variable capacitor circuit 32 may include a varactor transistor 321. One end of the varactor transistor 321 is coupled to the first node (C), and the other end of the varactor transistor 321 is connected to the control voltage Vcap. A capacitance value of the varactor transistor 321 may be adjusted by changing a voltage value Vcap of the control voltage, so as to compensate for the parasitic capacitance change of the common-gate transistor array 312 relative to the output matching network 33 during gain switching, and further make the parasitic capacitance viewed from the first nodes (C and D) substantially constant.

Figure 3C:
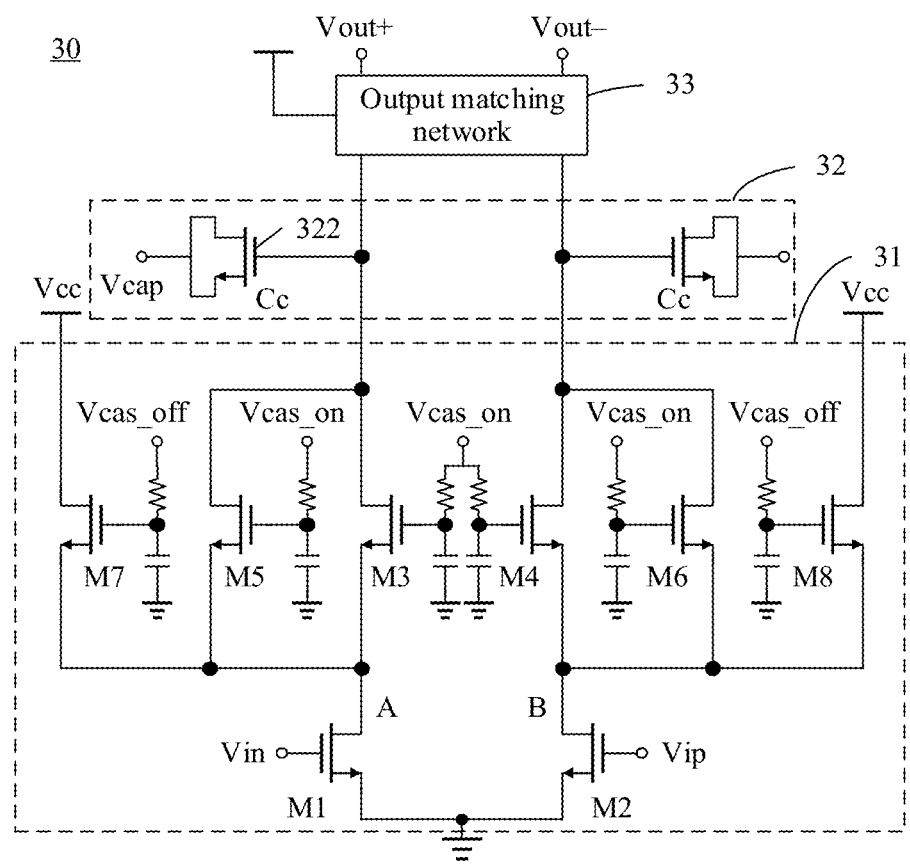

In another implementation of this embodiment, as shown in FIG. 3c, the variable capacitor circuit 32 may include a MOS transistor 322. A gate of the MOS transistor 322 is coupled to the first node (C), a source and a drain of the MOS transistor 322 are short-circuited and then connected to the control voltage Vcap, and a voltage value of the control voltage Vcap is controlled.

A gate capacitance of the MOS transistor 322 may be adjusted to compensate for a parasitic capacitance change of the common-gate transistor array relative to the output matching network 33 during gain switching, so that the step gain and the phase of the VGA 30 can be approximately constant.

Figure 3D:
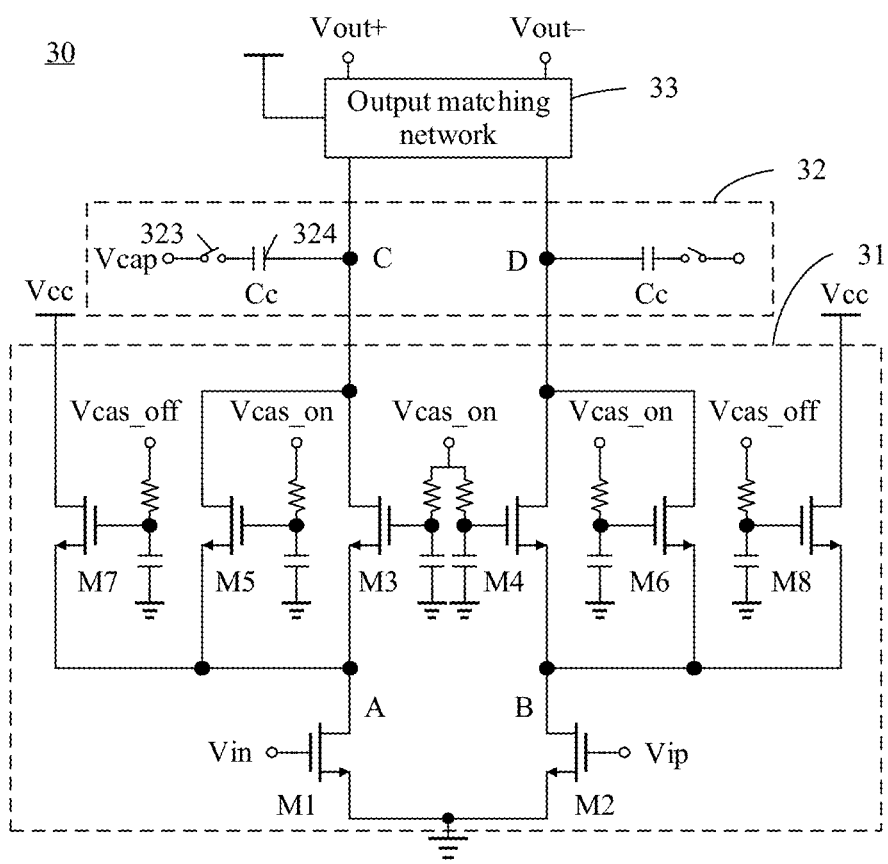

In still another implementation of this embodiment, as shown in FIG. 3d, the variable capacitor circuit 32 may include a switch 323 and a capacitor 324. One end of the switch 323 is coupled to one end of the capacitor 324, and the other end of the capacitor 324 is coupled to the first node (C). The other end of the switch 323 is connected to the control voltage Vcap, and the capacitance value of the variable capacitor circuit 32 connected to the VGA 30 can be changed by controlling whether the switch 323 is turned on, to further compensate for the parasitic capacitance change of the common-gate transistor array in the VGA 30 relative to the output matching network 33 during gain switching, so that the parasitic capacitance viewed from the first nodes (C and D) is approximately stable, thereby implementing an approximately constant step gain and phase of the VGA 30.

Figure 3E:
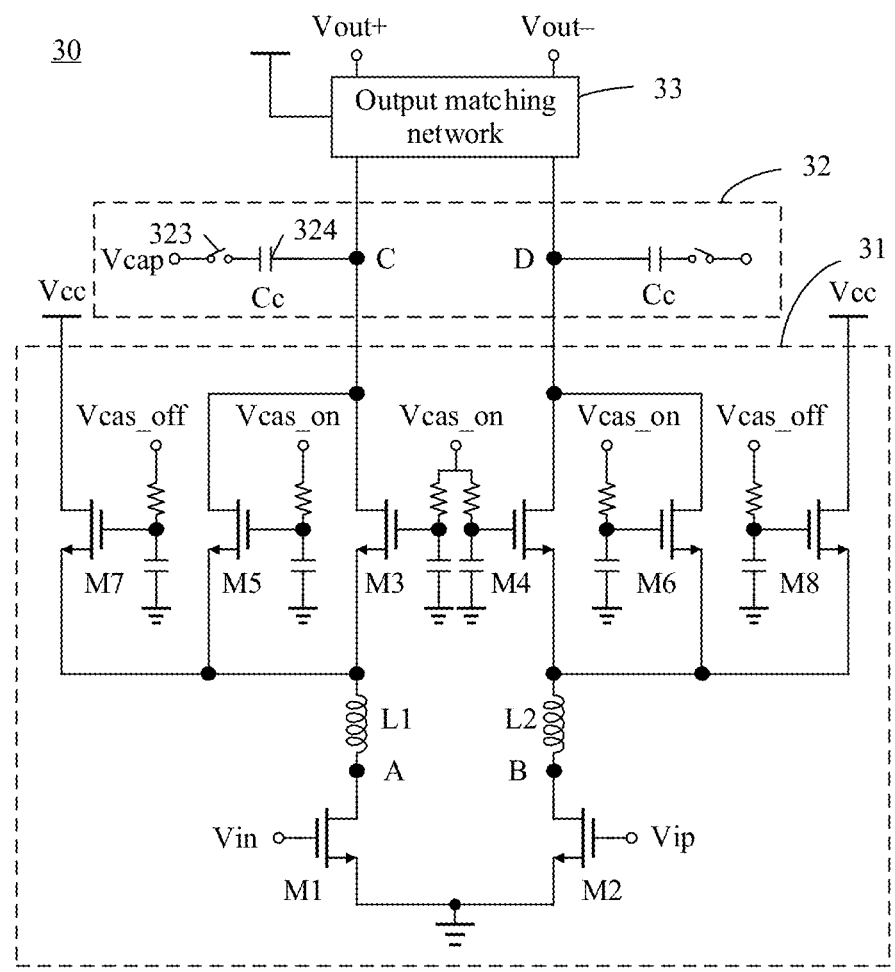

In another implementation of this embodiment, as shown in FIG. 3e, inductors L1 and L2 may be further introduced in the cascode circuit 31. One end of the inductor L1 is coupled to a drain of the common-source transistor M1 at the second node (A), and the other end of the inductor L1 is separately coupled to sources of the common-gate transistors (M3, M5, and M7) in the common-gate transistor array. One end of the inductor L2 is coupled to a drain of the common-source transistor M2 at the second node (B), and the other end of the inductor L2 is separately coupled to sources of the common-gate transistors (M4, M6, and M8) in the common-gate transistor array. By selecting a proper inductance value, the parasitic capacitance effect of the cascode circuit 31 at the second nodes (A and B) may be cancelled, and then, in combination with the variable capacitor circuit 32, the parasitic capacitance change of the cascode circuit 31 at the first nodes (C and D) is more accurately compensated during gain switching, to further improve the step gain and phase constancy of the VGA 30.

It should be noted that the foregoing shows only several alternative solutions of the variable capacitor circuit 32. A person skilled in the art should know that the variable capacitor circuit 30 may alternatively be implemented by using another circuit structure. This is not specifically limited in this application. Essentially, as long as the variable capacitor circuit 30 is connected to the first nodes (C and D) to adjust the parasitic capacitance of the cascode circuit 31 relative to the output matching network 33, this circuit structure is acceptable.

Figure 4A:
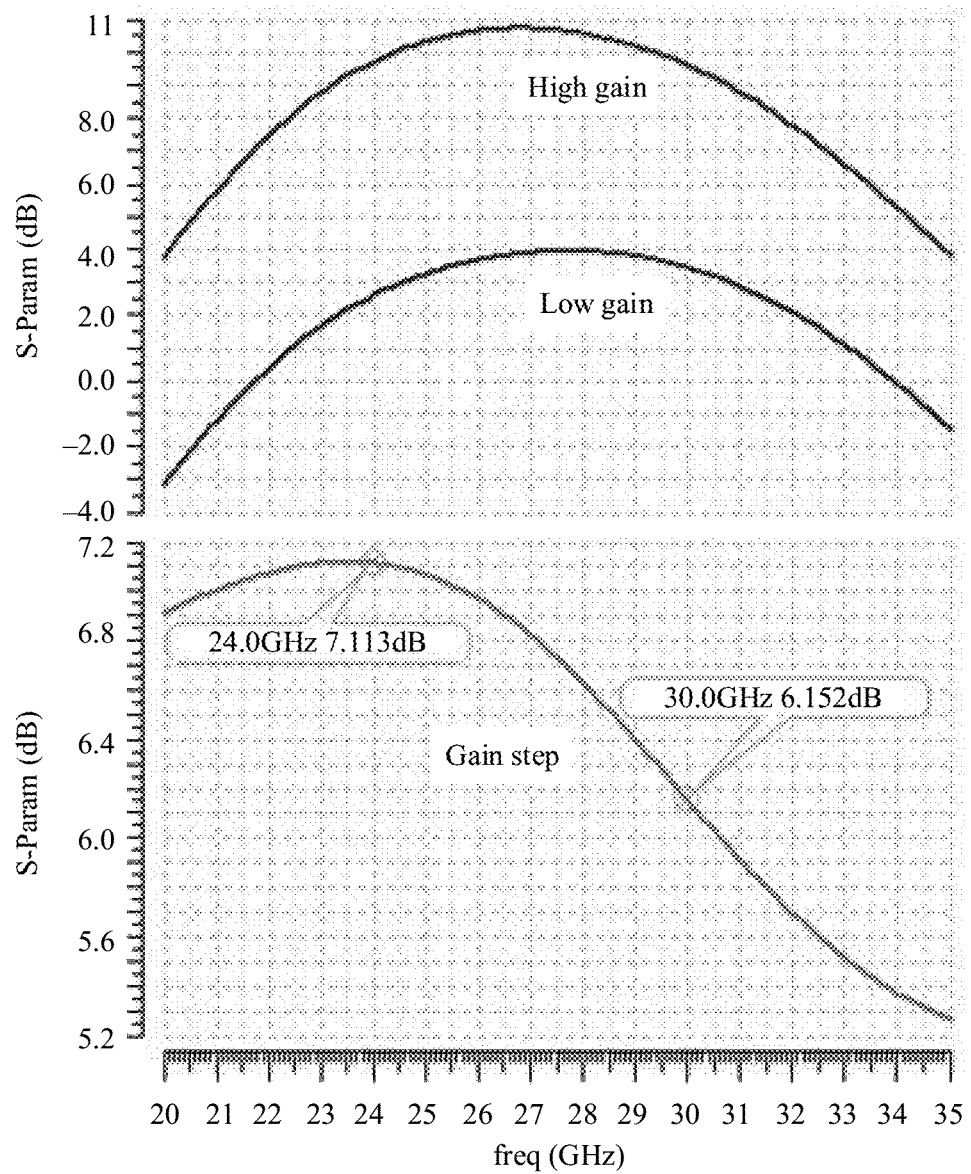
FIG. 4a is a schematic diagram of a step gain curve of an existing VGA shown in FIG. 2.
Figure 4B:
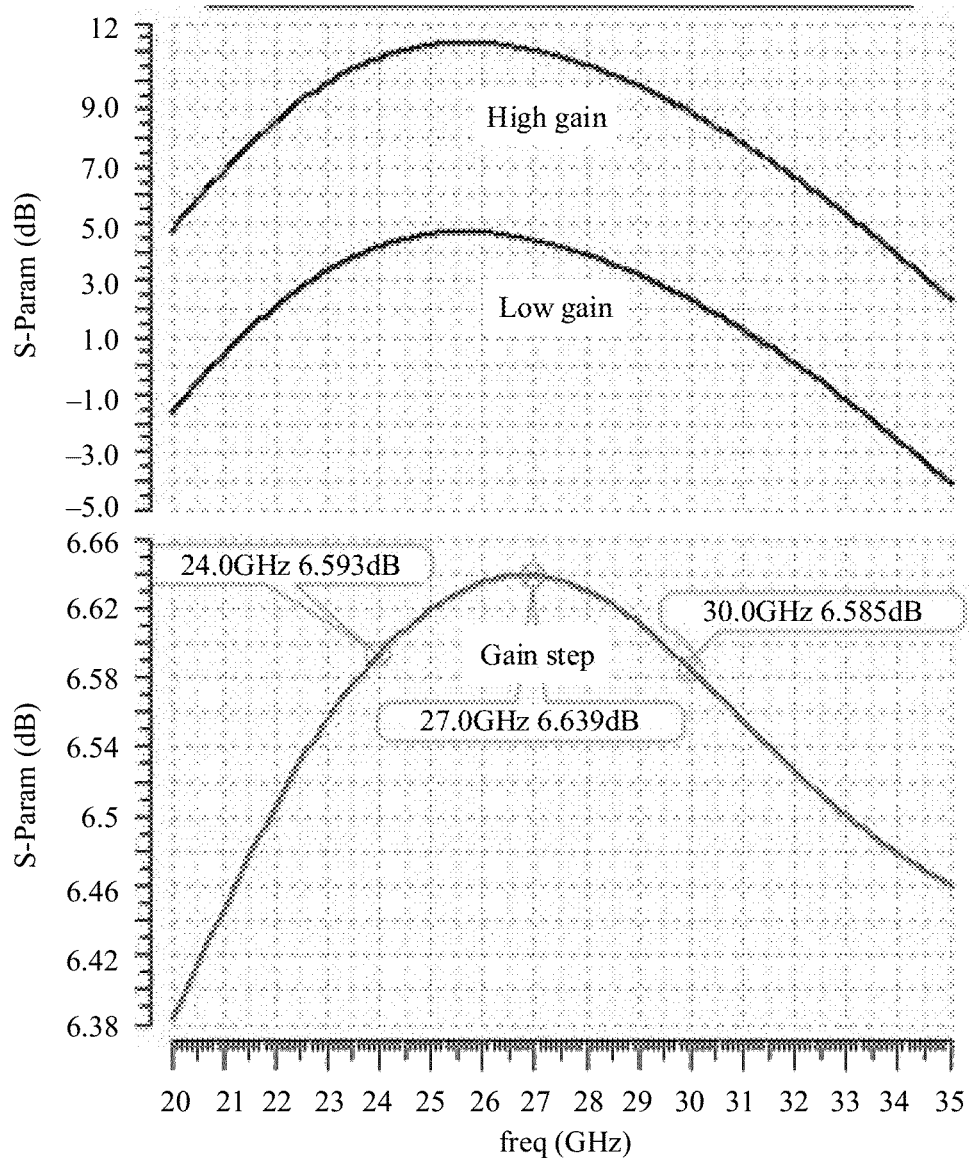

The following describes in detail an improvement effect of gain step consistency in a technical solution provided in this application with reference to FIG. 4a and FIG. 4b.

Figure 1:
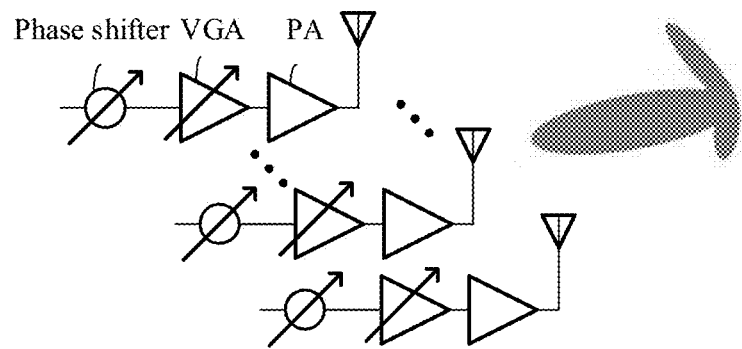
FIG. 1 is a schematic architectural diagram of a phased array receiver in the conventional technology.
Figure 2:
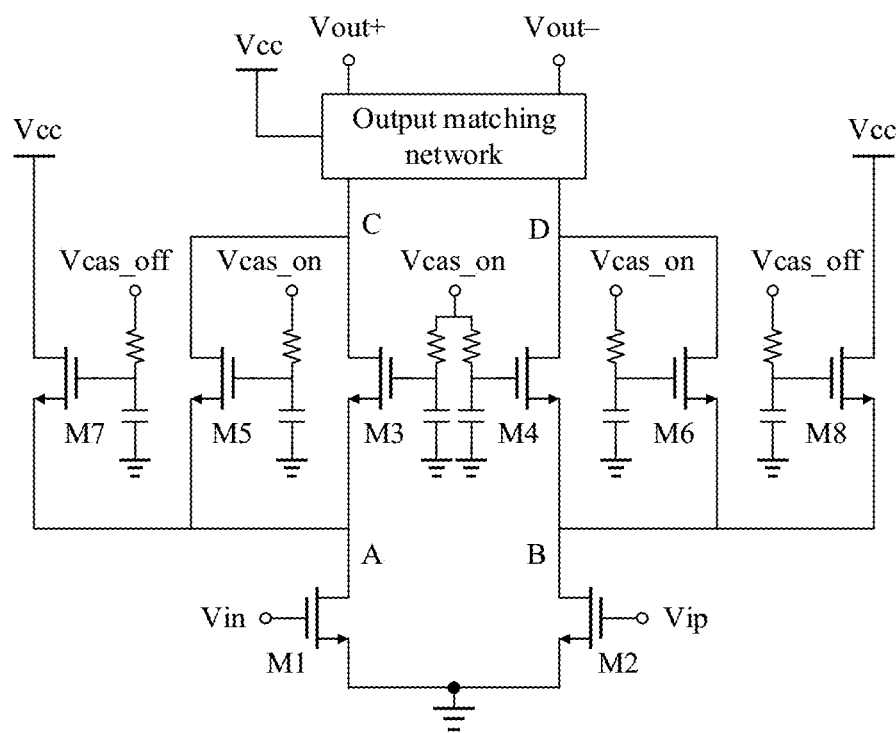
FIG. 2 is a schematic structural diagram of a VGA in the conventional technology.

FIG. 4a is a schematic diagram of a step gain curve when a transceiver uses the existing VGA shown in FIG. 2. In FIG. 4a, two curves for the high gain and the low gain each reflect a change relationship of a scattering parameter (also referred to as an S parameter, S-param) with a frequency when the VGA switches between the high gain mode and the low gain mode. A gain step curve reflects a difference value between the scattering parameters in the high gain mode and the low gain mode. It can be seen that in a frequency band range of 24 GHz to 30 GHz, the S parameter value corresponding to the gain step curve at the frequency 24 GHz is 7.113 dB, and the S parameter value corresponding to the gain step curve at the frequency 30 GHz is 6.152 dB. That is, a gain step difference of the VGA between the two frequencies is about 1 dB, and the gain step difference continues to deteriorate greatly as the frequency increases.

When the VGA provided in this embodiment of this application is used, a gain step curve of the VGA is shown in FIG. 4b. It can be seen that in a frequency band range of 24 GHz to 30 GHz, the S parameter value corresponding to the gain step curve at the frequency 24 GHz is 6.593 dB, the S parameter value corresponding to the gain step curve at the frequency 30 GHz is 6.585 dB, and the S parameter corresponding to the gain step curve at the frequency 27 GHz is a maximum value (6.639 dB). It can be seen that in the frequency band range of 24 GHz to 30 GHz, a gain step difference between any two frequencies is less than 0.1 dB, that is, the consistency of the gain step in a relatively wide frequency range is greatly improved.

Figure 5A:
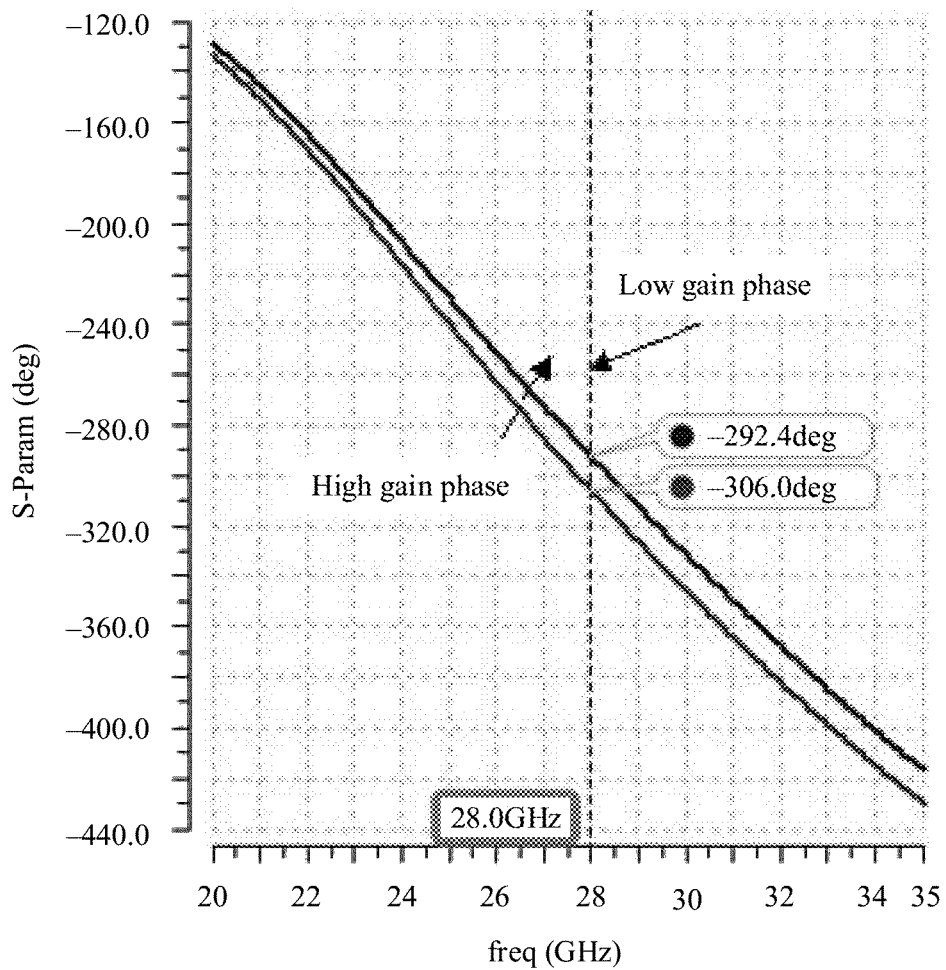
FIG. 5a is a schematic diagram of a phase curve of an existing VGA shown in FIG. 2.
Figure 5B:
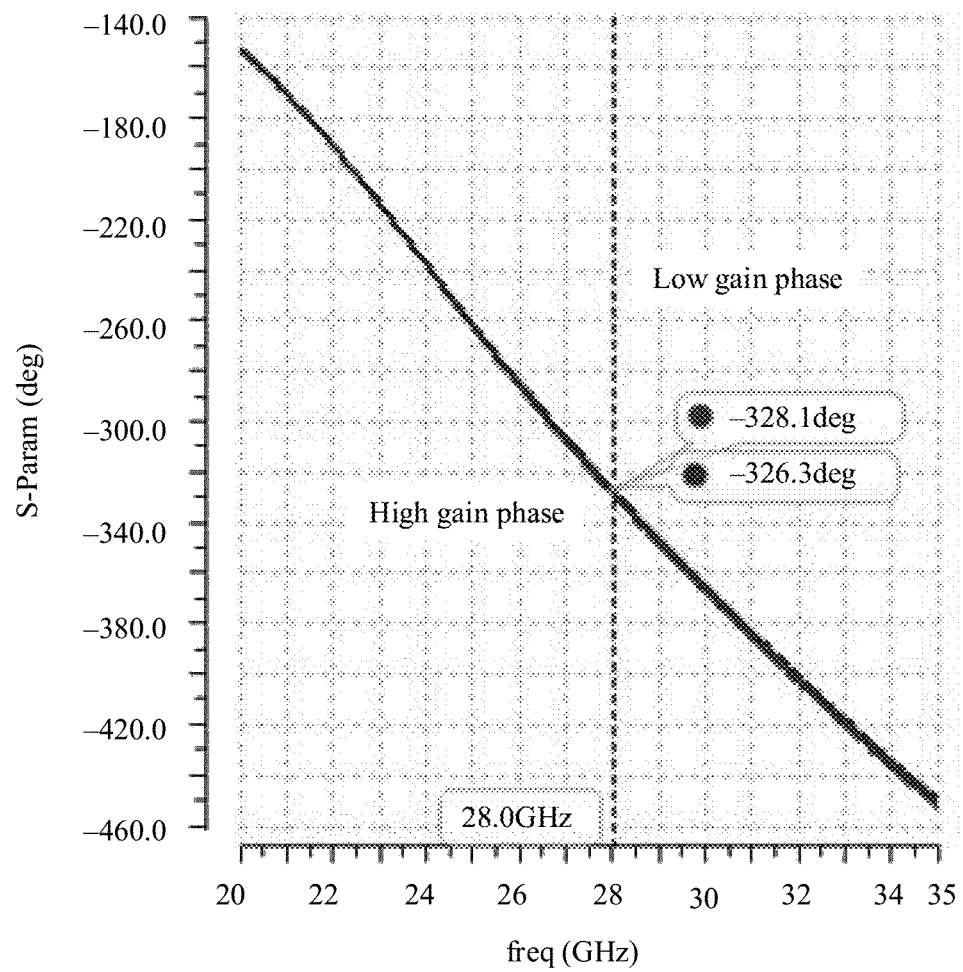

Further, with reference to FIG. 5a and FIG. 5b, the following describes in detail an improvement effect of phase constancy in the technical solutions provided in this application.

When a transceiver uses the existing VGA shown in FIG. 2, in the high gain mode and the low gain mode, a phase change trend of the VGA with a frequency is shown in FIG. 5a. For example, a frequency is 28 GHz, a phase change of the VGA in the low gain mode and the high gain mode is −292.4°−(−306.0°)=13.6°. After the technical solutions provided in this embodiment of this application are used, a phase change trend of the VGA with a frequency is shown in FIG. 5b. When an operating frequency is 28 GHz, the phase change of the VGA in the two gain modes are only −326.3°−(−328.1°)=1.8°. It can be learned that, when the technical solution provided in this embodiment of this application is used, the phase consistency of the VGA in different gain modes is greatly improved.

Figure 6:
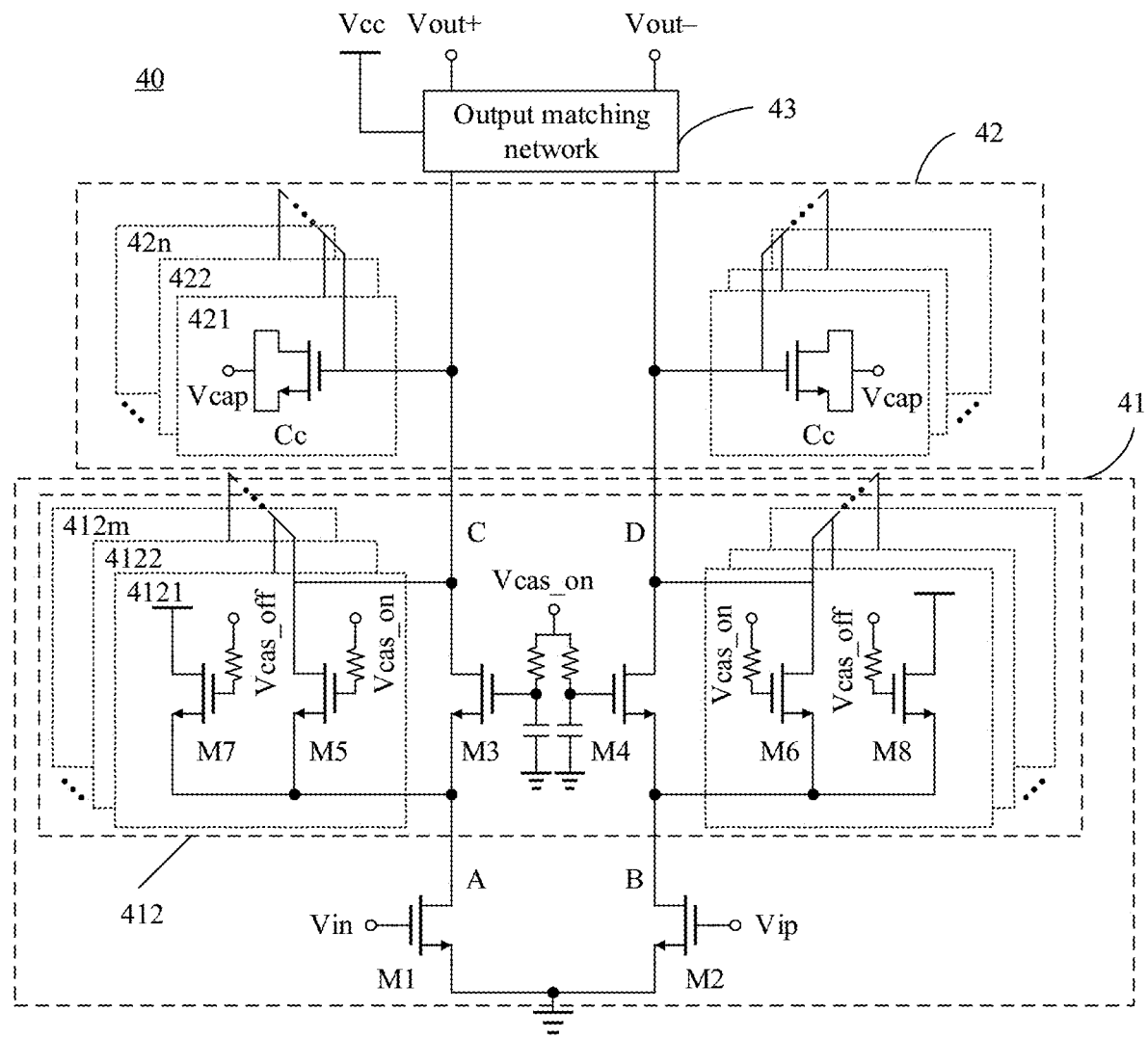
FIG. 6 is a schematic structural diagram of another VGA according to an embodiment of this application.

As shown in FIG. 6, an embodiment of this application further provides another VGA 40 with a constant phase and a constant step gain. In FIG. 6, the VGA 40 includes a cascode circuit 41, an output matching network 43, and a variable capacitor circuit 42 that is separately coupled to the cascode circuit 41 and the output matching network 43 at first nodes (C and D). A common-gate transistor array 412 is in a differential structure. One branch of the common-gate transistor arrays 412 may include a common-gate transistors M3 and m groups of common-gate transistor branches connected in parallel, m is an integer greater than 1, and any common-gate transistor branch includes common-gate transistors M5 and M7. For a connection relationship between each common-gate transistor branch and the common-gate transistor M3, refer to FIG. 3a to FIG. 3d and the description of the connection relationship between M3, M5, and M7 in the foregoing embodiments. Details are not described herein again.

It should be noted that, in the VGA 30 shown in FIG. 3a to FIG. 3d, only two levels exist: the high gain and the low gain. However, in the VGA 40 shown in FIG. 6, because the common-gate transistor array 412 has m common-gate transistor branches connected in parallel. By separately controlling turn-on or turn-off of the common-gate transistor in each common-gate transistor branch, a current output by the common-gate transistor array 412 to the output matching network 43 may be adjusted at a plurality of levels. Correspondingly, the VGA 40 may implement a plurality of gain levels to meet the requirements of different application scenarios.

Further, as shown in FIG. 6, the variable capacitor circuit 42 may also include n variable capacitor branches connected in parallel, where the n branches connected in parallel are separately coupled to the common-gate transistor array 412 and the output matching network 43 at first nodes (C and D), and n is an integer greater than 1. For a structure of any variable capacitor branch, refer to the foregoing description of the variable capacitor circuit 32 in FIG. 3a to FIG. 3d. Details are not described again.

The current of the output matching network 43 may be adjusted at a plurality of levels by turning on or off the common-gate transistor in the common-gate transistor array 412, and correspondingly, a parasitic capacitance of the common-gate transistor array 412 relative to the output matching network 43 also has a plurality of changes. Therefore, by using the variable capacitor circuit 42, more fine-grained compensation may be performed for a parasitic capacitance change of the common-gate transistor array 412, so that the parasitic capacitance viewed from the first nodes (C and D) can be approximately stable, thereby implementing an approximately constant step gain and phase of the VGA 40. A quantity of variable capacitor branches may be equal to or different from a quantity of common-gate transistor branches.

Figure 7A:
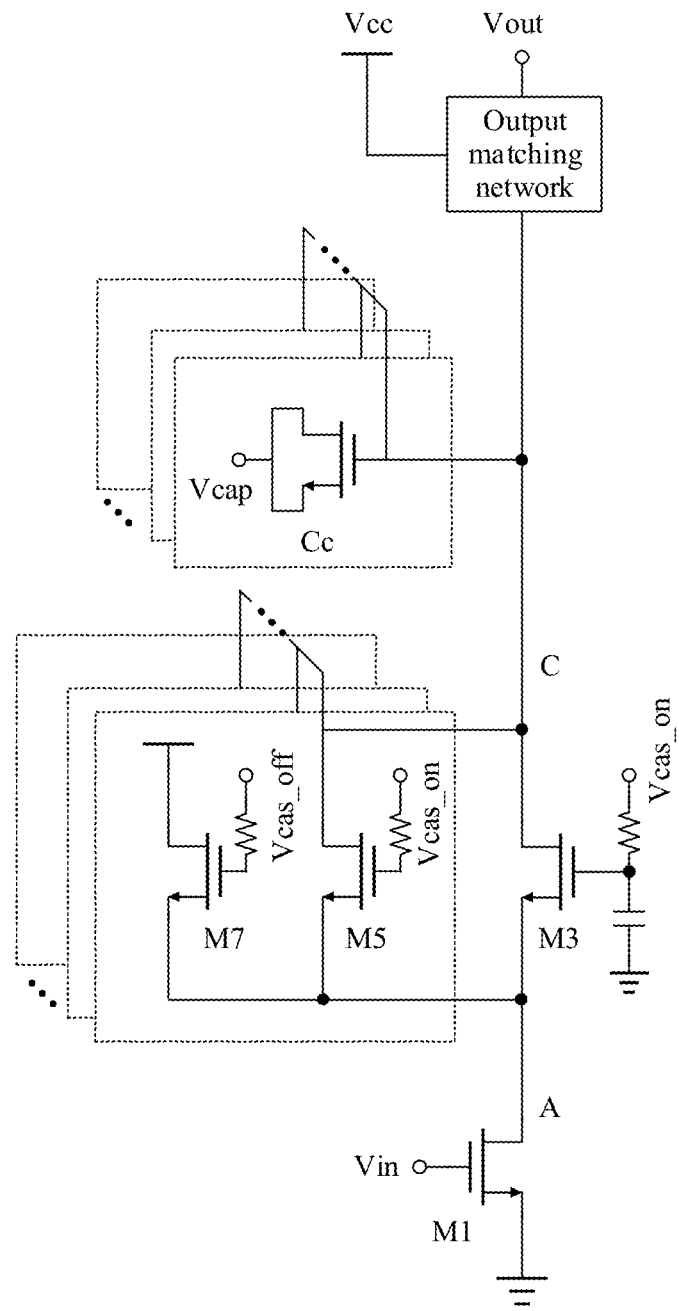
FIG. 7a to FIG. 7c are schematic structural diagrams of a VGA based on a single-ended structure according to an embodiment of this application.
Figure 7B:
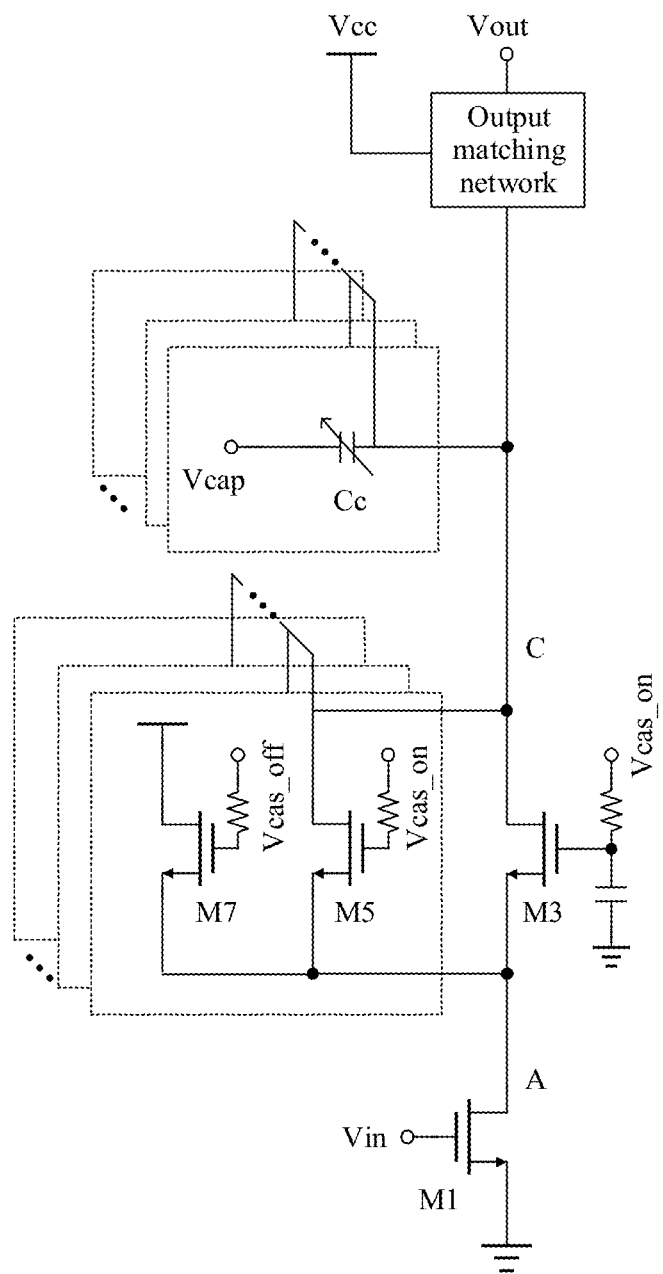
Figure 7C:
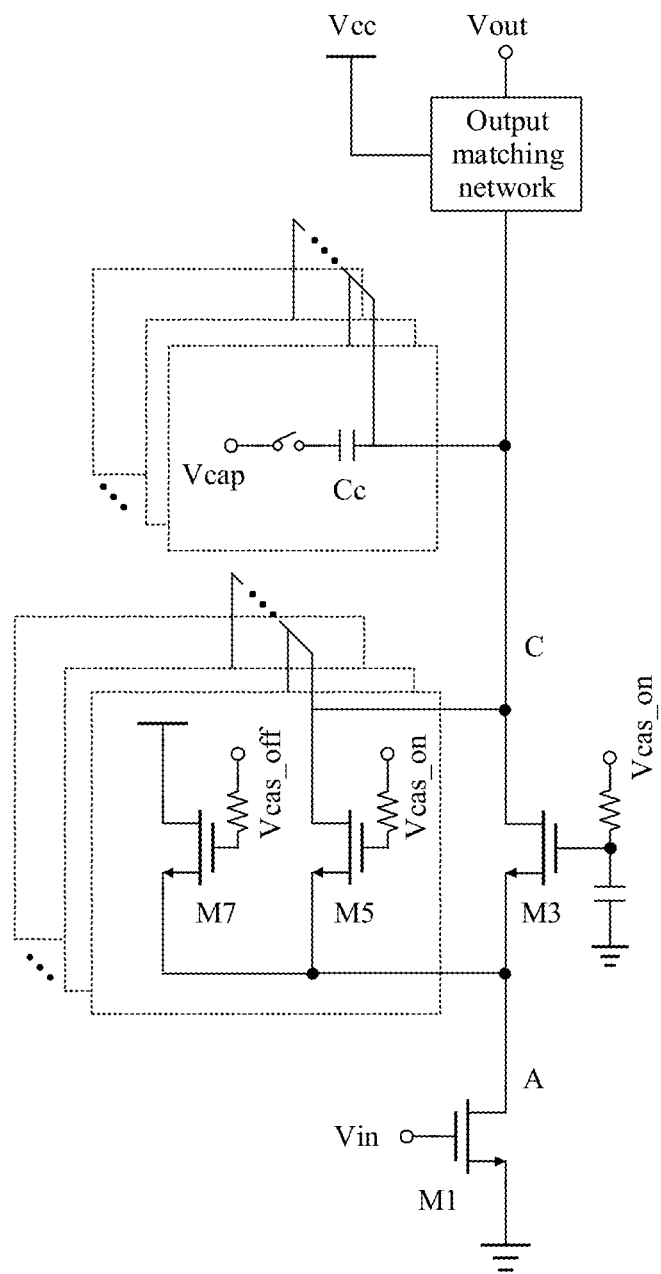

As shown in FIG. 7a to FIG. 7c, an embodiment of this application further provides a VGA based on a single-ended structure. FIG. 7a shows a single-ended circuit in which a MOS transistor is used as a compensation capacitor. FIG. 7b shows a single-ended circuit implementation form that uses a varactor as a compensation capacitor. FIG. 7c shows an implementation form of a single-ended circuit that uses a switch and a capacitor as a compensation capacitor. Because a differential circuit may be considered as two single-ended circuits of a symmetrical design, for details of the VGAs that use a single-ended structure shown in FIG. 7a to FIG. 7c, refer to descriptions of one of the differential circuits shown in FIG. 3a to FIG. 3d. Details are not described herein again.

An embodiment of this application further provides a phased array system. Any channel of the phased array system includes the VGA described in the foregoing embodiment. In this embodiment, the phased array system may be specifically a phased array receiver, a phased array transmitter, or a phased array transceiver. For specific structures and working principles of the phased array system, refer to the conventional technology. Details are not described herein again.

Further, because the VGA provided in this embodiment of this application has a substantially constant phase and a step gain, a requirement of a 5G broadband signal for gain step consistency can be met. Therefore, the phased array transceiver may work on a 5G NR (new radio, new radio) frequency band. For example, the 5G NR frequency band may include an n257 frequency band (26.5 GHz-29.5 GHz), an n258 frequency band (24.25 GHz-27.5 GHz), an n260 frequency band (37 GHz-40 GHz), an n261 frequency band (27.5 GHz-28.35 GHz), and the like.

It should be understood that specific embodiments described herein are merely common embodiments of the present invention, but are not intended to limit the present invention. Any modification, equivalent replacement, and improvement made without departing from the spirit and principle of the present invention shall fall within the protection scope of the present invention.

What is claimed is:

1. A variable-gain amplifier, comprising:
   a cascode circuit, comprising a first amplification transistor and a second amplification transistor array that are cascaded, the second amplification transistor array comprising a plurality of second amplification transistors connected in parallel and configured to output an adjustable current to an output matching network; and the first amplification transistor is a common-source transistor, and the plurality of second amplification transistors are common-gate transistors; or the cascode circuit is a common-emitter common-base circuit, the first amplification transistor is a common-emitter amplification circuit, and the second amplification transistor array is a common-base amplification circuit;
   a variable capacitor circuit, coupled to the second amplification transistor array and coupled to the output matching network at first nodes; and
   wherein the variable capacitor circuit comprises a varactor transistor, one end of the varactor transistor is coupled to a first node of the first nodes, and the other end of the varactor transistor is connected to a control voltage Vcap used to adjust a capacitance value of the varactor transistor.

2. The variable-gain amplifier according to claim 1, wherein the variable capacitor circuit is configured to compensate for a parasitic capacitance change of the second amplification transistor array relative to the first nodes when the variable-gain amplifier performs gain switching.

3. A variable-gain amplifier, comprising:
   a cascode circuit, comprising a first amplification transistor and a second amplification transistor array that are cascaded, the second amplification transistor array comprising a plurality of second amplification transistors connected in parallel and configured to output an adjustable current to an output matching network; and the first amplification transistor is a common-source transistor, and the plurality of second amplification transistors are common-gate transistors; or the cascode circuit is a common-emitter common-base circuit, the first amplification transistor is a common-emitter amplification circuit, and the second amplification transistor array is a common-base amplification circuit;

a variable capacitor circuit, coupled to the second amplification transistor array and coupled to the output matching network at first nodes; and wherein the variable capacitor circuit comprises a metal oxide semiconductor (MOS) transistor, a gate of the MOS transistor is coupled to a first node of the first nodes, and a source and a drain of the MOS transistor are short-circuited and then connected to a control voltage used to adjust a gate capacitance of the MOS transistor.

4. A variable-gain amplifier, comprising:

a cascode circuit, comprising a first amplification transistor and a second amplification transistor array that are cascaded, the second amplification transistor array comprising a plurality of second amplification transistors connected in parallel and configured to output an adjustable current to an output matching network; and the first amplification transistor is a common-source transistor, and the plurality of second amplification transistors are common-gate transistors; or the cascode circuit is a common-emitter common-base circuit, the first amplification transistor is a common-emitter amplification circuit, and the second amplification transistor array is a common-base amplification circuit;

a variable capacitor circuit, coupled to the second amplification transistor array and coupled to the output matching network at first nodes; and wherein the variable capacitor circuit comprises a switch and a capacitor, one end of the switch is coupled to one end of the capacitor, the other end of the capacitor is coupled to a first node of the first nodes, the other end of the switch is connected to a control voltage Vcap, and a capacitance value of the variable capacitor circuit is changed by controlling the switch to be turned on or off.

5. The variable-gain amplifier according to claim 1, wherein the second amplification transistor array is configured to output the adjustable current by changing a quantity of second amplification transistors to be turned on between the second amplification transistor array and the output matching network.

6. The variable-gain amplifier according to claim 5, wherein the first amplification transistor is a transistor M1, the second amplification transistor array comprises a transistor M3 and at least one group of transistor branches, and the transistor branches comprise a transistor M5 and a transistor M7, sources of the transistor M3, the transistor M5, and the transistor M7 are separately coupled to a drain of the transistor M1, emitters of the transistor M3, the transistor M5, and the transistor M7 are coupled to a collector of the transistor M1, a drain/collector of the transistor M7 is connected to a power supply voltage Vcc, and a drain/collector of the transistor M3 and the transistor M5 are coupled to the first node.

7. The variable-gain amplifier according to claim 6, wherein the cascode circuit further comprises an inductor, one end of the inductor is coupled to the drain/collector of the transistor M1, and the other end of the inductor is separately coupled to the sources/emitters of the transistor M3, the transistor M5, and the transistor M7.

8. The variable-gain amplifier according to claim 1, wherein the cascode circuit is a differential circuit or a single-ended circuit.

9. The variable-gain amplifier according to claim 1, wherein the variable capacitor circuit is a differential circuit or a single-ended circuit.

10. The variable-gain amplifier according to claim 3, wherein the second amplification transistor array is configured to output the adjustable current by changing a quantity of second amplification transistors to be turned on between the second amplification transistor array and the output matching network.

11. The variable-gain amplifier according to claim 10, wherein the first amplification transistor is a transistor M1, the second amplification transistor array comprises a transistor M3 and at least one group of transistor branches, and the transistor branches comprise a transistor M5 and a transistor M7, sources of the transistor M3, the transistor M5, and the transistor M7 are separately coupled to a drain of the transistor M1, emitters of the transistor M3, the transistor M5, and the transistor M7 are coupled to a collector of the transistor M1, a drain/collector of the transistor M7 is connected to a power supply voltage Vcc, and a drain/collector of the transistor M3 and the transistor M5 are coupled to the first node.

12. The variable-gain amplifier according to claim 11, wherein the cascode circuit further comprises an inductor, one end of the inductor is coupled to the drain/collector of the transistor M1, and the other end of the inductor is separately coupled to the sources/emitters of the transistor M3, the transistor M5, and the transistor M7.

13. The variable-gain amplifier according to claim 3, wherein the cascode circuit is a differential circuit or a single-ended circuit.

14. The variable-gain amplifier according to claim 3, wherein the variable capacitor circuit is a differential circuit or a single-ended circuit.

15. The variable-gain amplifier according to claim 4, wherein the second amplification transistor array is configured to output the adjustable current by changing a quantity of second amplification transistors to be turned on between the second amplification transistor array and the output matching network.

16. The variable-gain amplifier according to claim 15, wherein the first amplification transistor is a transistor M1, the second amplification transistor array comprises a transistor M3 and at least one group of transistor branches, and the transistor branches comprise a transistor M5 and a transistor M7, sources of the transistor M3, the transistor M5, and the transistor M7 are separately coupled to a drain of the transistor M1, emitters of the transistor M3, the transistor M5, and the transistor M7 are coupled to a collector of the transistor M1, a drain/collector of the transistor M7 is connected to a power supply voltage Vcc, and a drain/collector of the transistor M3 and the transistor M5 are coupled to the first node.

17. The variable-gain amplifier according to claim 16, wherein the cascode circuit further comprises an inductor, one end of the inductor is coupled to the drain/collector of the transistor M1, and the other end of the inductor is separately coupled to the sources/emitters of the transistor M3, the transistor M5, and the transistor M7.

18. The variable-gain amplifier according to claim 4, wherein the cascode circuit is a differential circuit or a single-ended circuit.

19. The variable-gain amplifier according to claim 4, wherein the variable capacitor circuit is a differential circuit or a single-ended circuit.

* * * * *